(12) United States Patent
Meng et al.

(10) Patent No.: US 12,405,066 B2
(45) Date of Patent: Sep. 2, 2025

(54) VAPOR CHAMBER AND HEAT DISSIPATING DEVICE

(71) Applicant: JIANGXI XINFEI NEW MATERIAL CO., LTD, Nanchang (CN)

(72) Inventors: Kai Meng, Nanchang (CN); Zhongshang Dou, Nanchang (CN); Jing Gao, Nanchang (CN)

(73) Assignee: JIANGXI XINFEI NEW MATERIAL CO., LTD, Nanchang (CN)

( * ) Notice: Subject to any disclaimer, the term of this patent is extended or adjusted under 35 U.S.C. 154(b) by 238 days.

(21) Appl. No.: 18/136,289

(22) Filed: Apr. 18, 2023

(65) Prior Publication Data

US 2023/0258412 A1    Aug. 17, 2023

Related U.S. Application Data

(63) Continuation of application No. PCT/CN2020/121852, filed on Oct. 19, 2020.

(51) Int. Cl.
*F28D 15/04* (2006.01)
*F28D 15/02* (2006.01)
*F28D 21/00* (2006.01)

(52) U.S. Cl.
CPC ....... *F28D 15/046* (2013.01); *F28D 15/0233* (2013.01); *F28D 2021/0029* (2013.01)

(58) Field of Classification Search
CPC .............. F28D 15/0233; F28D 15/046; F28D 2021/0029; H05K 7/20263
See application file for complete search history.

(56) References Cited

U.S. PATENT DOCUMENTS

| 2009/0056917 A1* | 3/2009 | Majumdar ............ F28D 15/046 |
| | | 165/104.26 |
| 2011/0198059 A1* | 8/2011 | Gavillet ................ H01L 23/473 |
| | | 977/773 |

(Continued)

FOREIGN PATENT DOCUMENTS

| CN | 103826412 A | * | 5/2014 |
| CN | 105091648 A | * | 11/2015 |

(Continued)

OTHER PUBLICATIONS

Machine translation of CN 103826412 (Year: 2025).*

(Continued)

*Primary Examiner* — Eric S Ruppert
*Assistant Examiner* — Hans R Weiland

(57) ABSTRACT

A vapor chamber and a heat dissipating device are provided. The vapor chamber includes a first cover plate defining a first side and a second cover plate defining a second side. Support portions are disposed on the first side of the first cover plate at intervals. The second side of the second cover plate is opposite to the first side of the first cover plate. An edge of the second side is connected with an edge of the first side. The second side of the second cover plate defines capillary grooves. Nanoparticles are accumulated on a groove wall of each of the capillary grooves. The nanoparticles are hydrophilic. Gaps between the nanoparticles are communicated. One end of each of the support portions abuts against the second side. Gaps between the support portions are communicated to form a heat dissipating cavity communicated with the capillary grooves.

11 Claims, 9 Drawing Sheets

(56) References Cited

U.S. PATENT DOCUMENTS

| | | | | |
|---|---|---|---|---|
| 2012/0051489 | A1* | 3/2012 | Varanasi | F28F 13/182 |
| | | | | 165/185 |
| 2012/0279068 | A1* | 11/2012 | Mahefkey | F28D 15/046 |
| | | | | 29/890.032 |
| 2015/0198375 | A1 | 7/2015 | Saito et al. | |
| 2016/0216042 | A1* | 7/2016 | Bozorgi | F28D 15/0233 |
| 2022/0163268 | A1* | 5/2022 | Lewis | F28D 15/0233 |

FOREIGN PATENT DOCUMENTS

| | | |
|---|---|---|
| CN | 207733150 U | 8/2018 |
| CN | 110476033 A | 11/2019 |
| CN | 210128646 U | 3/2020 |
| CN | 210868523 U | 6/2020 |
| TW | 584799 B | 4/2004 |

OTHER PUBLICATIONS

Machine translation of CN 105091648 (Year: 2025).*
International Search Report issued in corresponding International application No. PCT/CN2020/121852, mailed Jul. 19, 2021.
Written Opinion of the International Searching Authority for No. PCT/CN2020/121852.

* cited by examiner

VAPOR CHAMBER AND HEAT DISSIPATING DEVICE

TECHNICAL FIELD

The present disclosure relates to a technical field of heat dissipation, and in particular to a vapor chamber and a heat dissipating device.

BACKGROUND

With coming of the 5G communication era, information processing volume of chips of cell phones is increasing, and the power consumption of the cell phones and heat generated by the cell phones are also increasing, which proposes high requirements for cell phone heat dissipating systems. With an excellent heat dissipating effect and an ultra-thin structure, a vapor chamber (VC) becomes a standard device for a 5G cell phone cooling system. The vapor chamber is a vacuum chamber in which an inner wall defines micro-fine structures. When heat is transferred from a heat source to a heating end of the vapor chamber, liquid in the vacuum chamber is heated to vaporize. Then, vaporized liquid fills the vacuum chamber and flows to a condensing end of the vapor chamber to liquefy. During a liquefaction, vaporized liquid releases the heat accumulated, and then the liquid is returned to the heating end of the vapor chamber through a capillary channel of each of the micro-fine structures. The heat dissipating process is run in cycles.

At present, a capillary core of the vapor chamber mainly comprises a porous inner wall formed by sintering and/or a copper mesh. However, there are following problems in the prior art. In a conventional capillary channel, capillary pressure and liquid storage are unable to be balanced. In order to improve the capillary pressure of the capillary channel, it is necessary to reduce a size of the capillary channel (a radius of an effective meniscus). Paradoxically, a large depth of the capillary channel is unable to be obtained if a width of the capillary channel is reduced, which greatly reduces an amount of liquid stored in the capillary channel.

SUMMARY

In view of defects in the prior art, it is necessary to provide a vapor chamber and a heat dissipating device to solve problems mentioned above.

One embodiment of the present disclosure provides the vapor chamber. The vapor chamber comprises a first cover plate and a second cover plate.

The first cover plate defines a first side. Support portions are disposed on the first side of the first cover plate at intervals. Gaps between the support portions are communicated with each other to form a heat dissipating cavity.

The second cover plate defines a second side. The second side of the second cover plate is opposite to the first side of the first cover plate. An edge of the second side of the second cover plate is connected and sealed with an edge of the first side of the first cover plate. The second side of the second cover plate defines capillary grooves. Nanoparticles are accumulated on a groove wall of each of the capillary grooves. The nanoparticles are hydrophilic. Gaps between the nanoparticles of each of the capillary grooves are communicated. One end, close to the second cover plate, of each of the support portions, abuts against the second side of the second cover plate. Each of the capillary grooves is communicated with the heat dissipating cavity.

The nanoparticles are accumulated on the groove wall of each of the capillary grooves. The nanoparticles are hydrophilic. The gaps between the nanoparticles of each of the capillary grooves are communicated to form a capillary channel. On the premise that a liquid storage amount of the capillary grooves does not greatly change, an overall capillary pressure of each capillary channel is improved through the nanoparticles accumulated on the groove wall of each of the capillary grooves, which ensures that enough liquid is smoothly flowed back from the first cover plate to the second cover plate during working of the vapor chamber. Thus, a heat dissipating effect of the vapor chamber is good.

In some embodiments, the nanoparticles are sequentially and uniformly accumulated on the groove wall of each of the capillary grooves.

Therefore, the gaps between the nanoparticles in each of the capillary grooves are communicated with each other to form each capillary channel. Surface energy of the nanoparticles is high, which increases surface tension of the capillary grooves macroscopically and improves the capillary pressure of each capillary channel.

In some embodiments, the nanoparticles in each of the capillary grooves form stacked structures and/or granular structures. The stacked structures and/or the granular structures are scattered in each of the capillary grooves. The stacked structures and/or the granular structures do not contact with each other.

Each of the stacked structures and/or each of the granular structures do not contact with other tacked structures and/or other granular structures. Therefore, each of the stacked structures and/or each of the granular structures in each of the capillary grooves forms a respective capillary channel. The surface energy of the nanoparticles is high, which increases the surface tension of the capillary grooves macroscopically and improves the capillary pressure of each capillary channel.

In some embodiments, the nanoparticles are stacked in a dot shape or in a mesh shape on the groove wall of each of the capillary grooves.

Therefore, the gaps between the nanoparticles in each of the capillary grooves are communicated with each other to form each capillary channel. The surface energy of the nanoparticles is high, which increases the surface tension of the capillary grooves macroscopically and improves the capillary pressure of each capillary channel.

In some embodiments, an accumulation thickness of the nanoparticles in each of the capillary grooves is in a range of 0.1-20 μm.

Therefore, not only the liquid storage amount in the capillary grooves is improved, but also the capillary pressure in each capillary channel is improved.

In some embodiments, a diameter of each of the nanoparticles is in a range of 2-5000 nm.

A suspended hydroxyl group or a suspended surface active oxygen atom is disposed on a surface of each of the nanoparticles with the specific diameter. The surface of each of the nanoparticles is hydrophilic, so that each capillary channel and an interior of each of the nanoparticles is hydrophilic. Further, the surface energy of the nanoparticles is high, which increases the surface tension of the capillary grooves macroscopically and improves the capillary pressure of each capillary channel.

In some embodiments, the nanoparticles are made of one or more of a titanium dioxide, silicon dioxide, calcium carbonate, zinc oxide, aluminum oxide, cerium carbonate, cerium oxide, cerium fluoride, copper oxide, and cuprous oxide.

When the nanoparticles made of these materials reach nanometer size, the suspended hydroxyl group or the suspended surface active oxygen atom is disposed on the surface of each of the nanoparticles. The surface of each of the nanoparticles is hydrophilic, so that each capillary channel and an interior of each of the nanoparticles is hydrophilic. Further, the surface energy of the nanoparticles is high, which increases the surface tension of the capillary grooves macroscopically and improves the capillary pressure of each capillary channel.

In some embodiments, the capillary grooves are disposed side by side. The groove wall of each of the capillary grooves defines communicating openings. The communicating openings on the groove wall of each of the capillary grooves are staggered with the communicating openings on the groove wall of an adjacent capillary groove.

Therefore, the liquid in the capillary grooves is prevented from drying up by vaporization and by untimely refill.

In some embodiments, a depth of each of the capillary grooves in a direction perpendicular to the second cover plate is not less than a width of each of the capillary grooves in a direction parallel to the second cover plate.

Therefore, the capillary pressure applied to the liquid in the capillary grooves is increased to ensure that the liquefied liquid fast flows back into the capillary grooves.

In some embodiments, a width of each of the capillary grooves is in a range of 20-150 μm. The depth of each of the capillary grooves is in a range of 20-200 μm.

Therefore, the capillary pressure applied to the liquid in the capillary grooves is increased to ensure that the liquefied liquid fast flows back into the capillary grooves.

Another embodiment of the present disclosure further provides a heat dissipating device. The heat dissipating device comprises the vapor chamber mentioned above.

The nanoparticles are accumulated on the groove wall of each of the capillary grooves. The nanoparticles are hydrophilic. The gaps between the nanoparticles of each of the capillary grooves are communicated to form each capillary channel. On the premise that the liquid storage amount of the capillary grooves does not greatly change, the overall capillary pressure of each capillary channel is improved through the nanoparticles accumulated on the groove wall of each of the capillary grooves, which ensures that enough liquid is smoothly flowed back from the first cover plate to the second cover plate during working of the vapor chamber. Thus, the heat dissipating effect of the vapor chamber is good.

DETAILED DESCRIPTION

Figure 1:
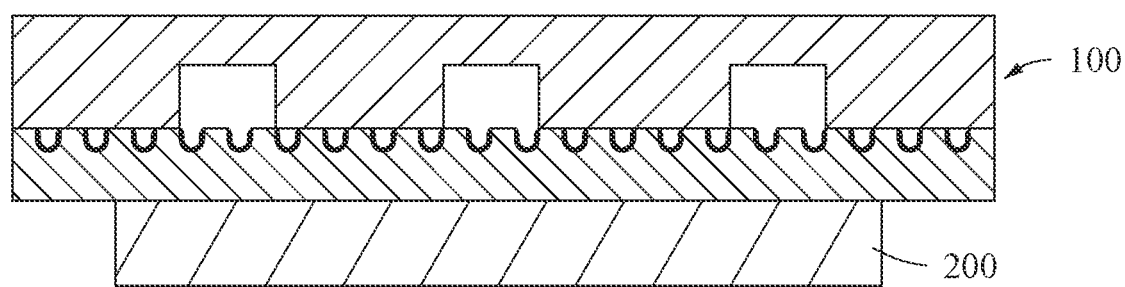
FIG. 1 is a schematic diagram of a vapor chamber according to one embodiment of the present disclosure where the vapor chamber is assembled with a chip.

Embodiments of the present disclosure are described in detail below. Examples of the embodiments are shown in accompanying drawings, in which same or similar reference numerals indicate the same or similar elements or elements with the same or similar functions. The embodiments described below with reference to the drawings are exemplary, and are intended to explain the present disclosure, but should not be regarded as a limitation to the present disclosure.

It should be understood that in the description of the present disclosure terms such as "central", "lateral", "lengthways", "length", "width", "thickness", "upper", "lower", "left", "right", "vertical", "horizontal", "top", "bottom", "inner", "outer", "clockwise", "counterclockwise", etc. indicate direction or position relationships shown based on the drawings, and are only intended to facilitate the description of the present disclosure and the simplification of the description rather than to indicate or imply that the indicated device or element must have a specific direction or constructed and operated in a specific direction, and therefore, shall not be understood as a limitation to the present disclosure.

In addition, terms such as "first" and "second" are only used for the purpose of description, rather than being understood to indicate or imply relative importance or hint the number of indicated technical features. Thus, the feature limited by "first" and "second" can explicitly or impliedly include one or more features. In the description of the present disclosure, the meaning of "a plurality of" is two or more unless otherwise specified.

It should be noted in the description of the present disclosure that, unless otherwise regulated and defined, terms such as "installation," "bonded," and "connection" shall be understood in broad sense, and for example, may refer to fixed connection or detachable connection or integral connection; may refer to mechanical connection or electrical connection; and may refer to direct connection or indirect connection through an intermediate medium or inner communication of two elements. For those of ordinary skill in the art, the meanings of the above terms in the present disclosure may be understood according to concrete conditions.

In the present disclosure, unless expressly stipulated and defined otherwise, the first feature is disposed "above" or "below" the second feature may mean that the first feature directly contact the second feature, or the first feature does not directly contact the second feature but connected with the second feature through other features between them. Furthermore, the first feature is disposed "on", "above" or "over" the second feature means that the first feature may arrange directly above and obliquely above the second feature, or it may merely indicate that a level of the first feature is greater than a level of the second feature. The first feature is disposed "below", "under", and "beneath" the second feature means that the first feature is disposed directly below and obliquely below the second feature, or it simply means that the level of the first feature is less than the level of second feature.

The following disclosure provides many different embodiments or examples for implementing different structures of the present disclosure. In order to simplify the disclosure of the present disclosure, components and settings of specific embodiments are described below. Of course, the embodiments are illustrative and are not intended to limit the present disclosure. In addition, reference numerals and/or reference letters may be repeated in different embodiments of the present disclosure, such repetition is for the purpose of simplicity and clarity and does not dictate a relationship between the various embodiments and/or settings discussed. Furthermore, the present disclosure provides embodiments of various specific processes and materials, but those skilled in the art may recognize the use of other processes and/or the use of other materials.

Figure 2:
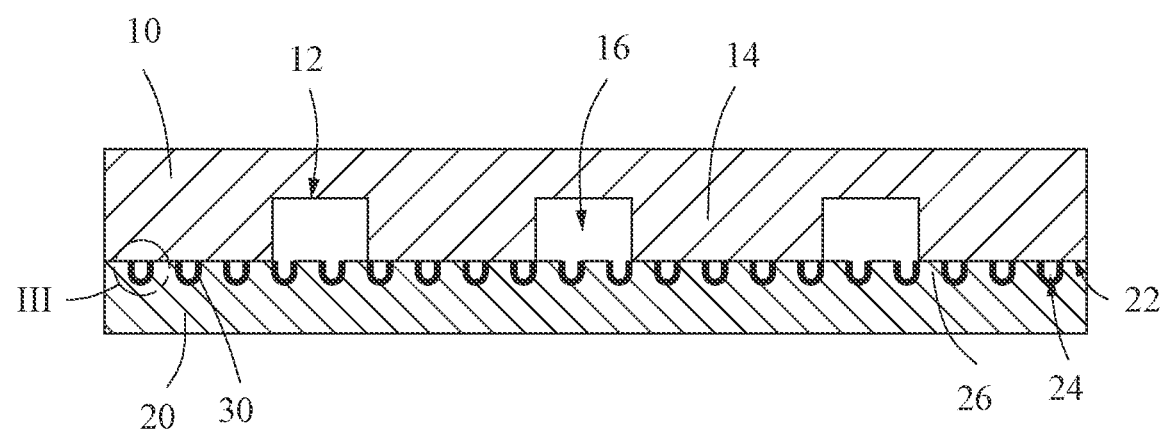
FIG. 2 is a schematic diagram of the vapor chamber according to one embodiment of the present disclosure.

As shown in FIG. 1, one embodiment of the present disclosure provides a vapor chamber 100. The vapor chamber is disposed on one side of a chip 200 and configured to cool the chip 200. As shown in FIG. 2, the vapor chamber 100 comprises a first cover plate 10 and a second cover plate 20.

The first cover plate 10 defines a first side 12. Support portions 14 are disposed on the first side 12 of the first cover plate 10 at intervals. As shown in FIG. 2, gaps between the support portions 14 are communicated with each other to form a heat dissipating cavity 16. The second cover plate 20 defines a second side 22. The second side 22 of the second cover plate 20 is opposite to the first side 12 of the first cover plate 10. An edge of the second side 22 of the second cover plate 20 is connected and sealed with an edge of the first side 12 of the first cover plate 10. The second side 22 of the second cover plate 20 defines capillary grooves 24. Nanoparticles 30 are accumulated on a groove wall of each of the capillary grooves 24. The nanoparticles 30 are hydrophilic. Gaps 32 between the nanoparticles 30 of each of the capillary grooves 24 are communicated. One end, close to the second cover plate 20, of each of the support portions 14 abuts against the second side 22 of the second cover plate 20. Each of the capillary grooves 24 is communicated with the heat dissipating cavity 16. In the embodiment, the edge of the second side 22 of the second cover plate is sealedly connected to an edge of the first side 12 of the first cover plate 10 by welding (diffusion welding).

In the embodiment, a protruding structure is disposed on the first side 12 of the first cover plate 10, and the protruding structure encloses the support portions 14 and is seaedly connected to the edge of the second side 22 of the second cover plate. It is understood that before use, liquid needs to be injected into the vapor chamber 100, and the liquid includes, but is not limited to, water, alcohol, or other media.

The nanoparticles 30 are accumulated on the groove wall of each of the capillary grooves 24. The nanoparticles 30 are hydrophilic. The gaps 32 between the nanoparticles 30 of each of the capillary grooves 24 are communicated to form a capillary channel. On the premise that a liquid storage amount of the capillary grooves 24 does not greatly change, an overall capillary pressure of each capillary channel is improved through the nanoparticles accumulated on the groove wall of each of the capillary grooves, which ensures that enough liquid is smoothly flowed back from the first cover plate 10 to the second cover plate 20 during working of the vapor chamber 100. Thus, a heat dissipating effect of the vapor chamber 100 is good.

The first cover plate 10 is substantially plate-shaped. A thickness of the first cover plate 10 and a thickness of the second cover plate 20 are both in a range of 20-200 μm, which makes the vapor chamber 100 thin and light. On the contrary, when the thickness of the first cover plate 10 and the thickness of the second cover plate 20 are both less than 20 μm, an overall thickness of the vapor chamber 100 is relatively thin, so processing difficulty is large, a strength of the vapor chamber 100 is unable to meet requirements thereof, and the vapor chamber 100 is easily deformed during use. When both of the thickness of the first cover plate 10 and the thickness of the second cover plate 20 are greater than 200 μm, the overall thickness of the vapor chamber 100 is relatively large, which does not meet light and thin requirements. In the embodiment, the thickness of the first cover plate 10 is equal to the thickness of the second cover plate 20.

Figure 4:
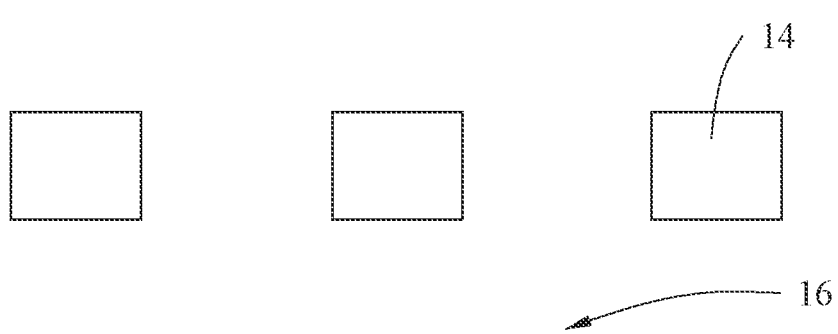
FIG. 4 is a bottom schematic diagram of support portions shown in FIG. 2.
Figure 4:
Figure 4:
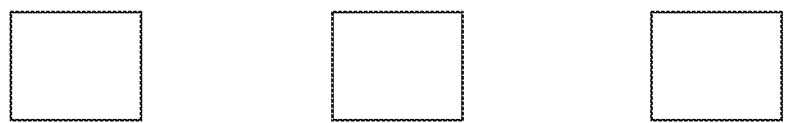

As shown in FIG. 4, each of the support portions 14 is generally a columnar structure. A cross section of each of the support portions 14 may be rectangular, circular, elliptical, triangular, etc. A length, a width, or a diameter of the cross section of each of the support portions 14 is in a range of 20 μm-150 μm. A height of each of the support portions 14 is 20-150 μm. Therefore, a strength of the support portions is ensured. On the contrary, when the height of each of the support portions 14 is less than 20 μm, a volume of the heat dissipating cavity 16 is small, a heat dissipating space is small, a thermal resistance of vaporized liquid is large, and a diffusion speed is low, so that the heat dissipating effect is not satisfied. When the height of each of the support portions 14 is greater than 150 μm, the overall thickness of the vapor chamber 100 is large, which does not meet the light and thin requirements.

A gap between each two adjacent support portions 14 is 0.1-2 mm. In this way, after the vaporized liquid reaches the heat dissipating cavity, the thermal resistance of vaporized liquid is small, the diffusion speed of the vaporized liquid is high, the vaporized liquid contacts a cold area (such as the support portions) at a high speed and liquefied, and the liquid return speed is high. On the contrary, when the gap between each two adjacent support portions 14 is less than 0.1 mm, the thermal resistance of the vaporized liquid is large and the diffusion speed of the vaporized liquid is low, so that the heat dissipation effect is poor. When the gap between each two adjacent support portions 14 is greater than 2 mm, the number of the support portions 14 is small, which is not conducive to liquefaction backflow of the vaporized liquid.

Figure 5:
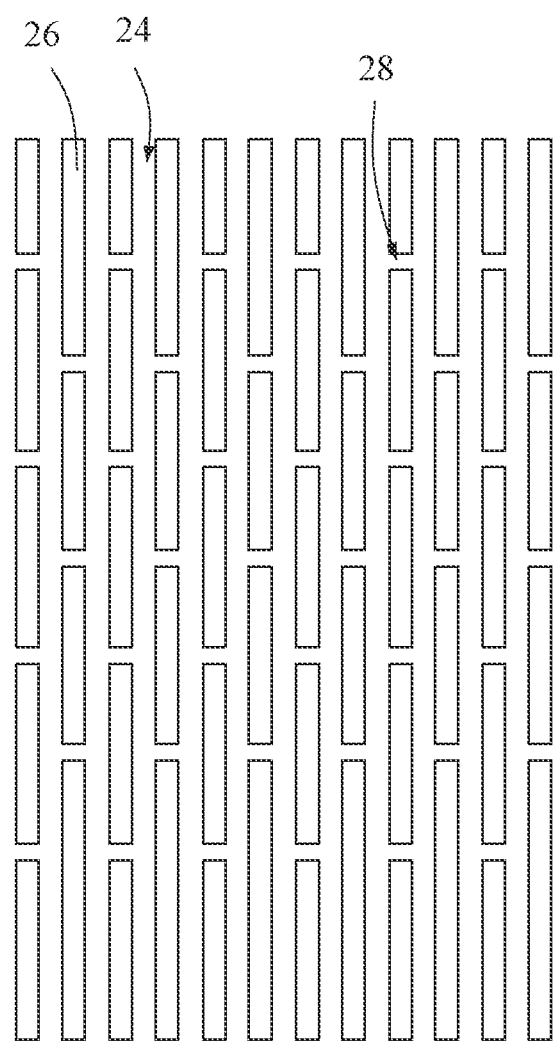
FIG. 5 is a top schematic diagram of capillary grooves shown in FIG. 2.

The second cover plate 20 is substantially plate shaped. The capillary grooves 24 are formed by etching on the second side 22 of the second cover plate 20. As shown in FIG. 5, the capillary grooves 24 are disposed side by side. The groove wall of each of the capillary grooves 24 defines communicating openings 26. The communicating openings on the groove wall 26 of each of the capillary grooves 24 are staggered with the communicating openings 28 on the groove wall of an adjacent capillary groove 24. In each two adjacent groove walls of the capillary groove 24, a first one of each two adjacent groove walls of the capillary groove 24 defines N communicating openings 28 and a second one of each two adjacent groove walls of the capillary groove 24 defines N+1 communicating openings 28. N is an integer and communicating openings 2 are circularly disposed. For example, the number of the groove walls 26 is twelve, and the number of the communicating openings 28 on the twelve grooves walls 26 is respectively 3, 4, 3, 4, 3, 4, 3, 4, 3, 4, 3, and 4.

A depth of each of the capillary grooves 24 in a direction perpendicular to the second cover plate 20 is not less than a width of each of the capillary grooves 24 in a direction parallel to the second cover plate 20. Therefore, the capillary pressure applied to the liquid in the capillary grooves 24 is increased to ensure that the liquefied liquid fast flows back into the capillary grooves 24.

A width of each of the capillary grooves 24 is in a range of 20-150 μm. Therefore, the thermal resistance of the vaporized liquid is small, the diffusion speed of the vaporized liquid is high, the vaporized liquid contacts the cold area (such as the support portions, the groove walls of the capillary grooves) at the high speed and liquefied, and the liquid return speed is fast. However, when the width of each of the capillary grooves 24 is less than 20 μm, etching is difficult and costly. When the width of each of the capillary grooves 24 is greater than 150 μm, the liquefied liquid is not easy to return.

The depth of each of the capillary grooves 24 is in a range of 20-200 μm. In this way, the strength of the grooves wall of each of the capillary grooves 24 is ensured. However, when the depth of each of the capillary grooves 24 is less than 20 μm, the liquid medium accommodated in the capillary grooves 24 is small, which is not conducive to heat dissipation. When the depth of each of the capillary grooves 24 is greater than 200 μm, the overall thickness of the vapor chamber 100 is large, which does not meet the light and thin requirements.

The first cover plate 10 and the second cover plate 20 are made of oxygen-free copper, copper alloy, or stainless steel. The above-mentioned materials have a relatively good heat conduction effect, so that the liquid quickly absorbs heat to vaporize. The vaporized liquid the contacts the materials, so that the vaporized liquid is quickly liquefied, and the heat dissipating efficiency is relatively high.

An area coverage of the nanoparticles 30 on the groove wall of each of the capillary grooves 24 is in a range of 30%-100%. Namely, the groove wall of each of the capillary grooves 24 may be a continuous nanoparticle accumulation structure, or may be a partially continuous nanoparticle accumulation structure.

Figure 3:
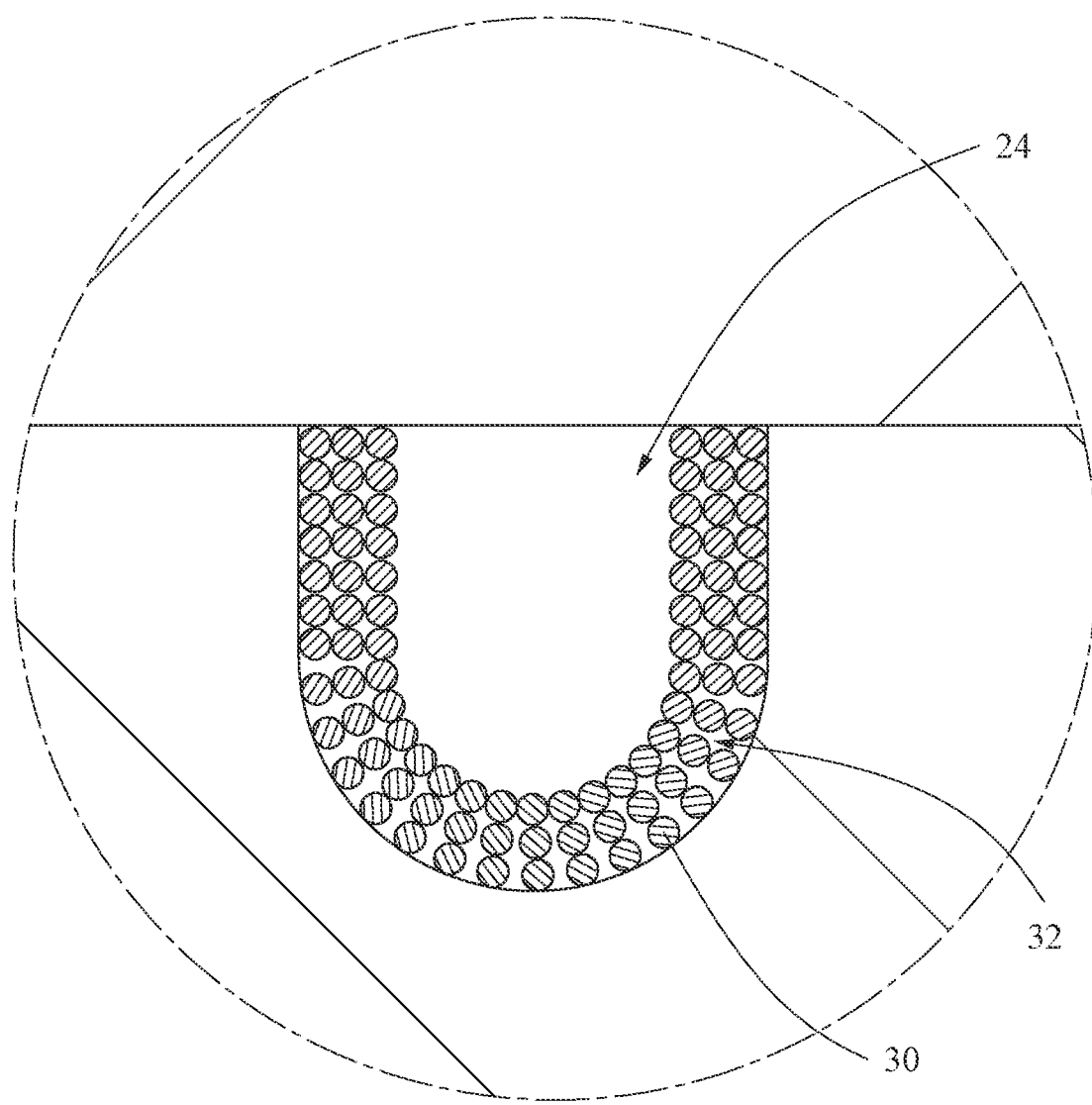
FIG. 3 is an enlarged schematic diagram of area III shown in FIG. 2 according to a first embodiment of the present disclosure.

As shown in FIG. 3, in a first embodiment of the present disclosure, the nanoparticles 30 are sequentially and uniformly accumulated on the groove wall 26 of each of the capillary grooves 24.

Therefore, the gaps 32 between the nanoparticles 30 in each of the capillary grooves 24 are communicated with each other to form each capillary channel. Further, surface energy of the nanoparticles 30 is high, which increases surface tension of the capillary grooves 24 macroscopically and improves the capillary pressure of each capillary channel.

Figure 6:
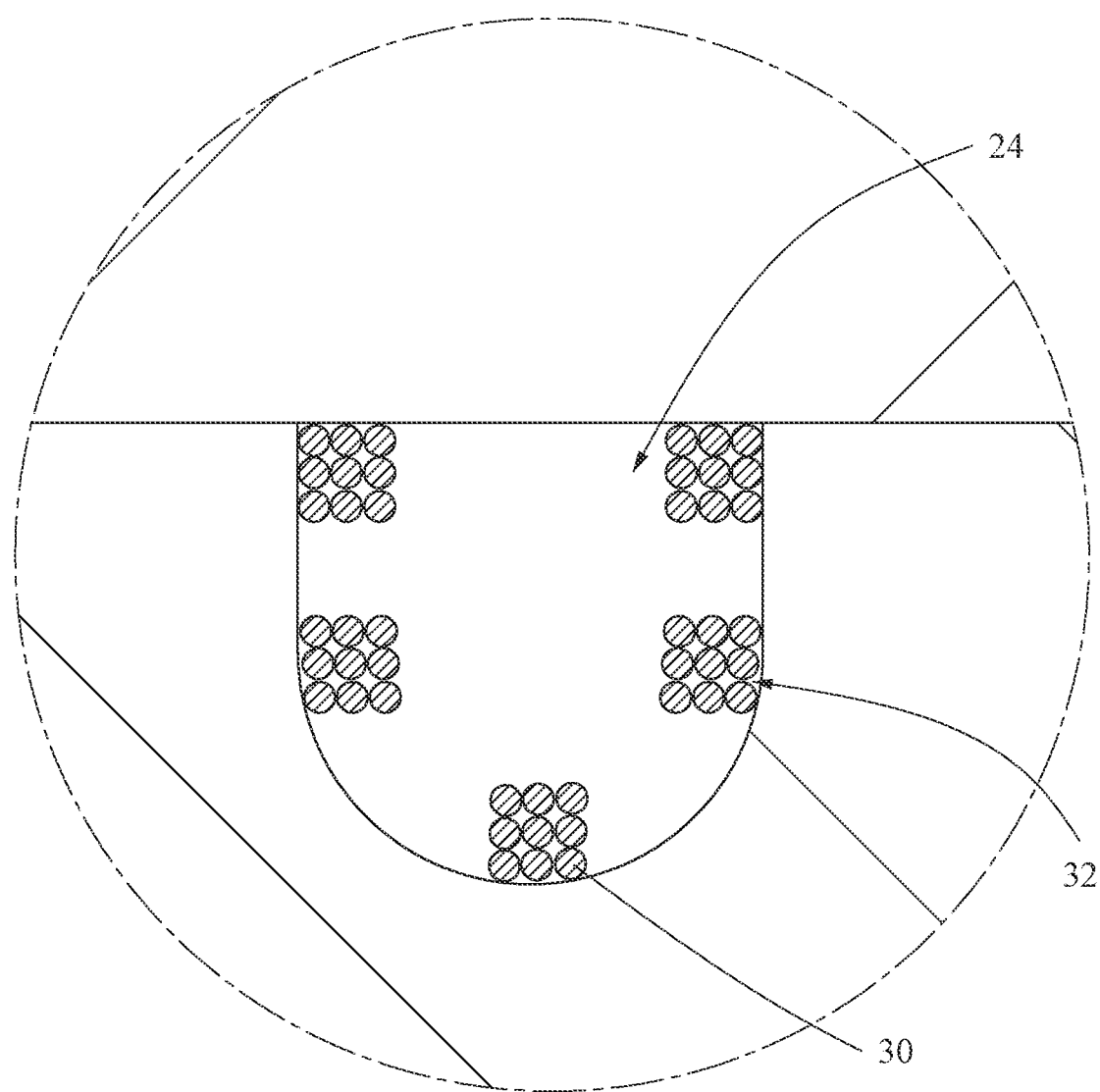
FIG. 6 is an enlarged schematic diagram of area III shown in FIG. 2 according to a second embodiment of the present disclosure.

As shown in FIG. 6, in a second embodiment of the present disclosure, the nanoparticles 30 are stacked in a dot shape or in a mesh shape on the groove wall 26 of each of the capillary grooves 24. Therefore, the gaps 32 between the nanoparticles 30 in each of the capillary grooves are communicated with each other to form each capillary channel. The surface energy of the nanoparticles 30 is high, which increases the surface tension of the capillary grooves macroscopically and improves the capillary pressure of each capillary channel.

Figure 7:
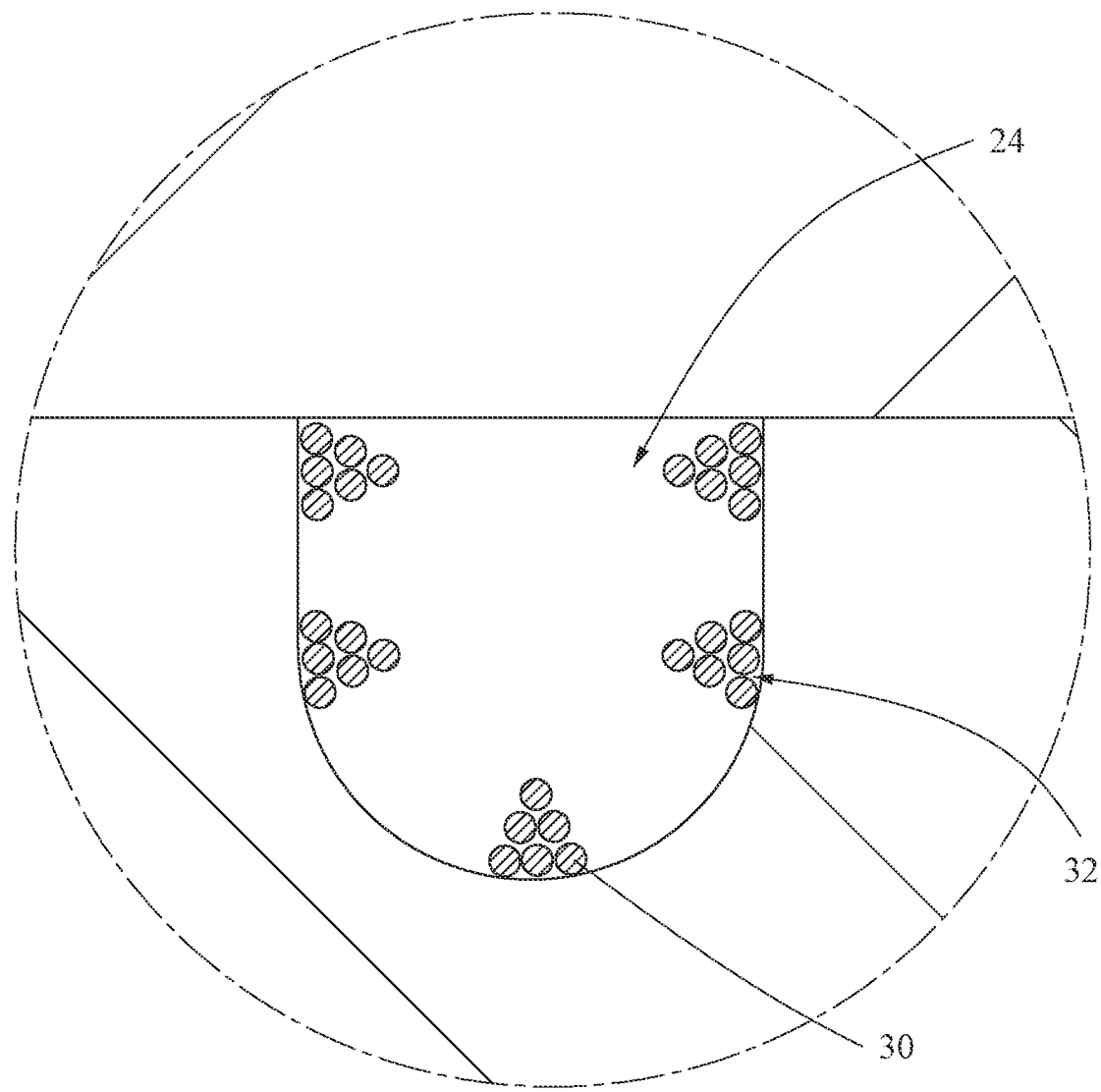
FIG. 7 is an enlarged schematic diagram of area III shown in FIG. 2 according to a third embodiment of the present disclosure.

As shown in FIG. 7, in a third embodiment of the present disclosure, the nanoparticles 30 in each of the capillary grooves 24 form stacked structures. The stacked structures are scattered in each of the capillary grooves 24. The stacked structures do not contact with each other.

It is understood that single-layer nanoparticles are stacked to form each of the stacked structures. Each of the stacked structures is stacked in a triangular, rectangular or trapezoidal shape. In the embodiment, each of the stacked structures is stacked in the triangular shape.

Figure 8:
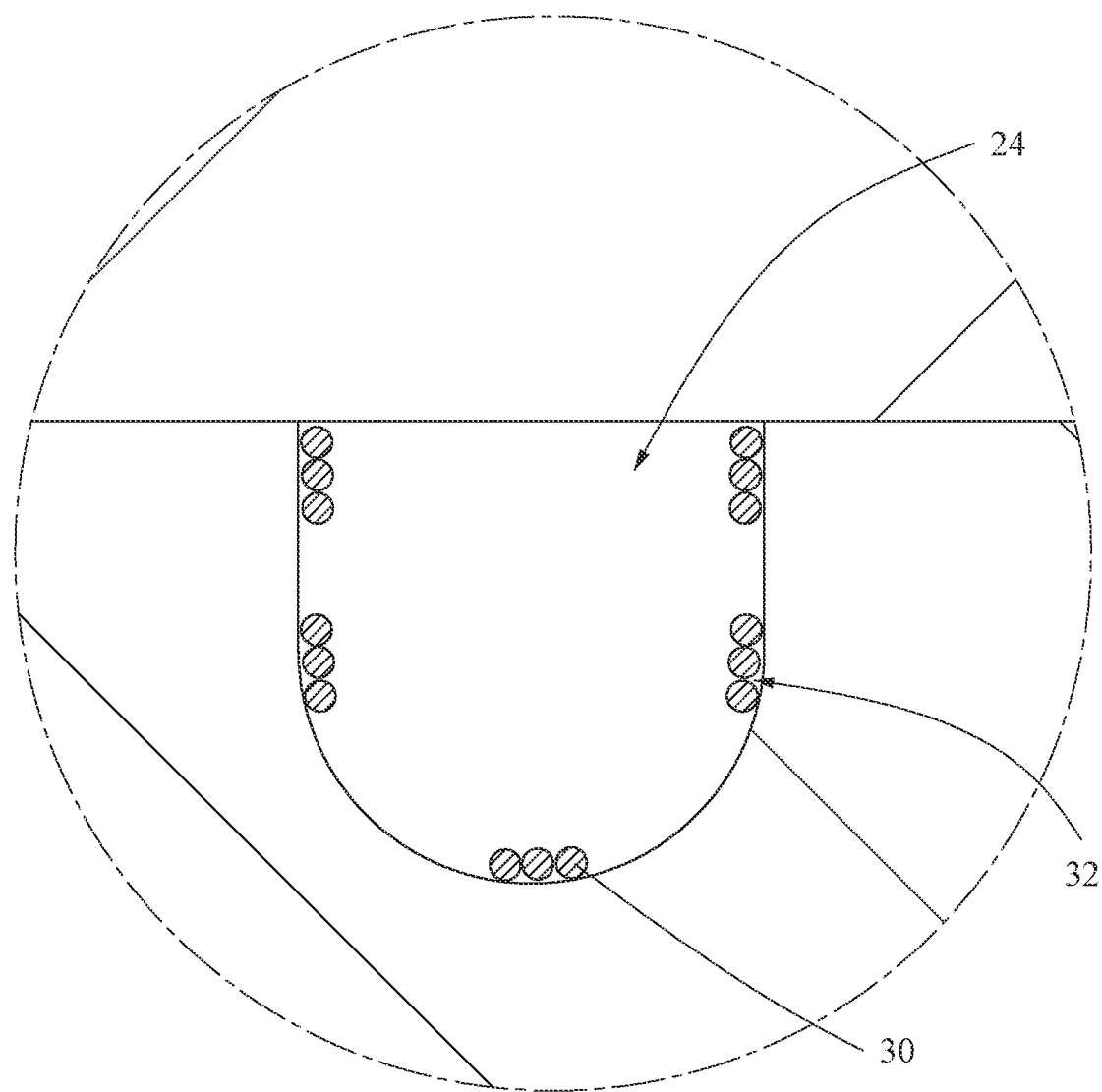
FIG. 8 is an enlarged schematic diagram of area III shown in FIG. 2 according to a fourth embodiment of the present disclosure.

As shown in FIG. 8, in a fourth embodiment of the present disclosure, the nanoparticles 30 in each of the capillary grooves 24 form granular structures. The granular structures are scattered in each of the capillary grooves. The granular structures do not contact with each other.

It is understood that single-layer nanoparticles form each of the granular structures.

Figure 9:
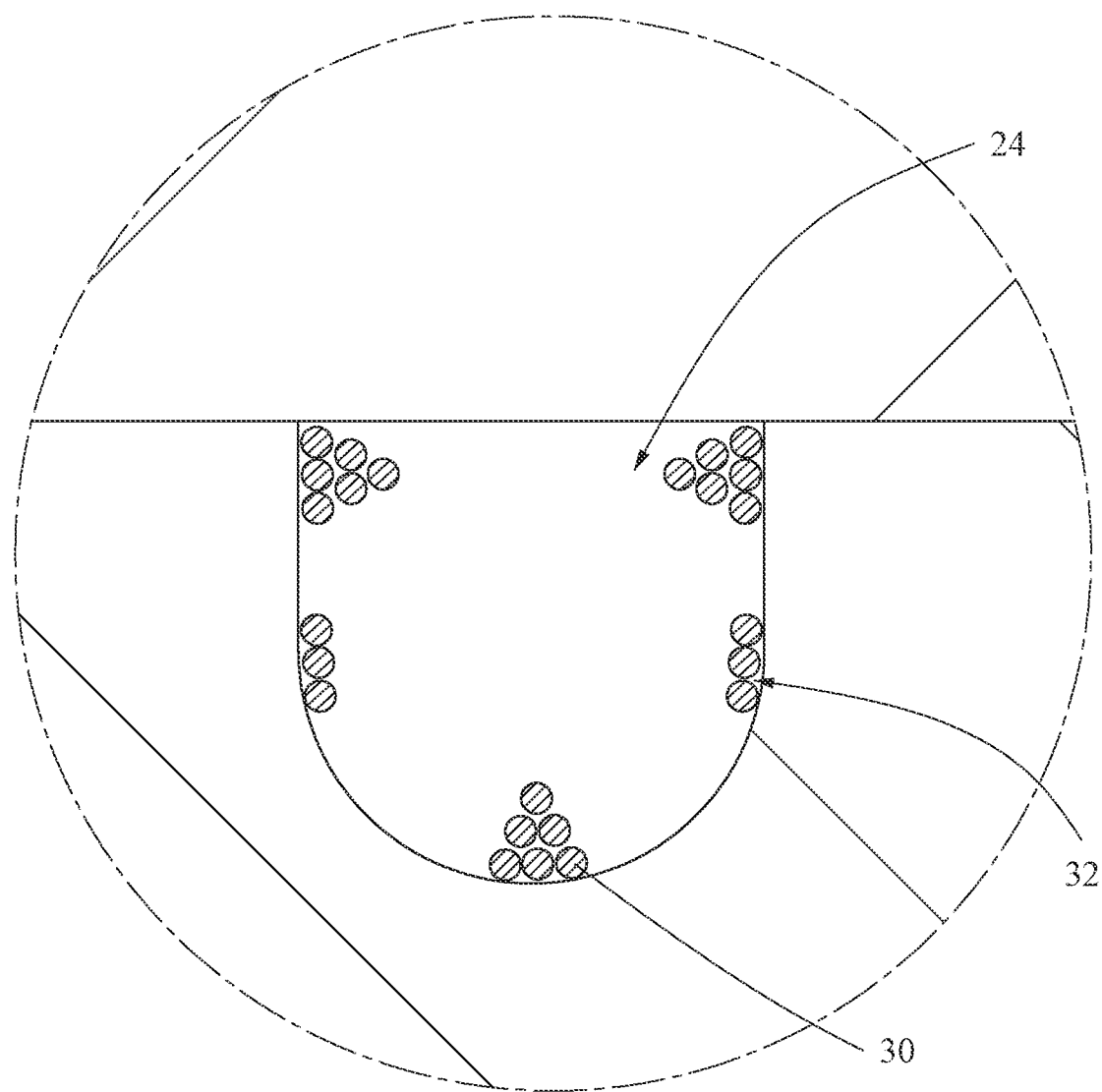
FIG. 9 is an enlarged schematic diagram of area III shown in FIG. 2 according to a fifth embodiment of the present disclosure.

As shown in FIG. 9, in a fifth embodiment of the present disclosure, the nanoparticles 30 in each of the capillary grooves 24 form the stacked structures and/the granular structures. The stacked structures and the granular structures are scattered in each of the capillary grooves. The stacked structures and the granular structures do not contact with each other.

Each of the stacked structures and/or each of the granular structures do not contact with other tacked structures and/or other granular structures. Therefore, each of the stacked structures and each of the granular structures in each of the capillary grooves forms a respective capillary channel. The surface energy of the nanoparticles is high, which increases the surface tension of the capillary grooves 24 macroscopically and improves the capillary pressure of each capillary channel.

It should be noted that in a porous structure formed by the nanoparticles 30 on the groove wall of each of the capillary grooves 24, gaps are defined between the nanoparticles 30. The gaps between the nanoparticles 30 are communicated with each other. According to the capillary pressure formula, $\Delta P = 2\sigma \cos\theta / r$, where $\sigma$ is a surface tension, $\theta$ is a solid-liquid contact angle, and r is a hydraulic diameter of the liquid circulation space. Although the gaps 32 between the nanoparticles 30 are not equal, the hydraulic diameter of the liquid circulation space of a continuous gaps formed by the gaps 32 between the nanoparticles 30 is 1-2 magnitude orders less than a size of the capillary grooves 24 of the vapor chamber 100. Thus, the capillary pressure on the surface of each porous structure is much greater than the capillary pressure of each of the capillary grooves 24 of the vapor chamber 100. During working, the liquid is filled into a microstructure of each of the capillary groove 24 and then filled in the porous structure of the groove wall of each of the capillary grooves 24. When the capillary pressure of the capillary groove 24 cannot make the liquid to flow from the second cover plate 20 to the first cover plate 10, the liquid is filled in the porous structure of the groove wall of each of the capillary grooves 24. By hydrogen bond interaction between the liquid (such as water), the liquid is able to continuously flow in the capillary groove 24.

In some embodiments, an accumulation thickness of the nanoparticles 30 in each of the capillary grooves is in a range of 0.1-20 μm. Therefore, not only the liquid storage amount in the capillary grooves is improved, but also the capillary pressure in each capillary channel is improved.

In some embodiments, a diameter of each of the nanoparticles 30 is in a range of 2-5000 nm. A suspended hydroxyl group or a suspended surface active oxygen atom is disposed on a surface of each of the nanoparticles 30 with the specific diameter. The surface of each of the nanoparticles 30 is hydrophilic, so that each capillary channel and an interior of each of the nanoparticles 30 is hydrophilic. Further, the surface energy of the nanoparticles is high, which increases the surface tension of the capillary grooves 24 macroscopically and improves the capillary pressure of each capillary channel.

The nanoparticles 30 are made of one or more of a titanium dioxide, silicon dioxide, calcium carbonate, zinc oxide, aluminum oxide, cerium carbonate, cerium oxide, cerium fluoride, copper oxide, and cuprous oxide. When the nanoparticles 30 made of these materials reach nanometer size, the suspended hydroxyl group or the suspended surface active oxygen atom is disposed on the surface of each of the nanoparticles. The surface of each of the nanoparticles 30 is hydrophilic, so that each capillary channel and an interior of each of the nanoparticles is hydrophilic. Further, the surface energy of the nanoparticles is high, which increases the surface tension of the capillary grooves 24 macroscopically and improves the capillary pressure of each capillary channel.

Another embodiment of the present disclosure further provides a heat dissipating device (not shown in the drawings). The heat dissipating device comprises the vapor chamber 100 mentioned above.

The nanoparticles 30 are accumulated on the groove wall 26 of each of the capillary grooves 24 of the vapor chamber 100 of the heat dissipating device. The nanoparticles 30 are hydrophilic. The gaps 32 between the nanoparticles 30 of each of the capillary grooves 24 are communicated to form each capillary channel. On the premise that the liquid storage amount of the capillary grooves 24 does not greatly change, the overall capillary pressure of each capillary channel is improved through the nanoparticles 30 accumulated on the groove wall of each of the capillary grooves, which ensures that enough liquid is smoothly flowed back from the first cover plate 10 to the second cover plate 20 during working of the vapor chamber 100. Thus, the heat dissipating effect of the vapor chamber 100 is good.

It is obvious to those skilled in the art that the present disclosure is not limited to details of the exemplary embodiments described above, and the present disclosure can be implemented in other specific forms without departing from the spirit or essential characteristics of the present disclosure. Therefore, regardless of which point, the embodiments are to be considered as exemplary and not restrictive, the scope of the present disclosure is defined by the appended claims rather than by the foregoing description. Therefore, it is intended that all changes falling within the meaning and scope of equivalency of the claims are encompassed by the present disclosure.

It should be noted that the above embodiments are only used to illustrate the technical solutions of the present disclosure and are not limited. Although the present disclosure has been described in detail with reference to optional embodiments, it should be understood by those skilled in the art that modifications or equivalent substitutions may be made to the technical solutions of the present disclosure without departing from the spirit and scope of the technical solutions of the present disclosure.

What is claimed is:

1. A vapor chamber, comprising:
a first cover plate, and
a second cover plate;
wherein the first cover plate defines a first side; support portions are disposed on the first side of the first cover plate at intervals; gaps between the support portions are communicated with each other to form a heat dissipating cavity; the gaps are configured to receive vaporized liquid, and the support portions are configured to liquefy the vaporized liquid into liquid;
wherein the second cover plate defines a second side; the second side of the second cover plate is opposite to the first side of the first cover plate; an edge of the second side of the second cover plate is connected with and sealed with an edge of the first side of the first cover plate; the second side of the second cover plate defines capillary grooves; nanoparticles are accumulated on a groove wall of each of the capillary grooves; the nanoparticles are hydrophilic; gaps between the nanoparticles of each of the capillary grooves are communicated; the gaps between the nanoparticles of each of the capillary grooves are configured to receive the liquid formed from and flowing from the support portions of the first cover plate; one end, close to the second cover plate, of each of the support portions abuts against the second side of the second cover plate; each of the capillary grooves is communicated with the heat dissipating cavity.

2. The vapor chamber according to claim 1, wherein the nanoparticles are sequentially and uniformly accumulated on the groove wall of each of the capillary grooves.

3. The vapor chamber according to claim 1, wherein the nanoparticles in each of the capillary grooves form stacked structures and/or granular structures; the stacked structures and/or the granular structures are scattered in each of the capillary grooves; the stacked structures and/or the granular structures do not contact with each other.

4. The vapor chamber according to claim 1, wherein the nanoparticles are stacked in a dot shape or in a mesh shape on the groove wall of each of the capillary grooves.

5. The vapor chamber according to claim 1, wherein an accumulation thickness of the nanoparticles in each of the capillary grooves is in a range of 0.1-20 μm.

6. The vapor chamber according to claim 5, wherein a diameter of each of the nanoparticles is in a range of 2-5000 nm.

7. The vapor chamber according to claim 6, wherein the nanoparticles are made of one or more of a titanium dioxide, silicon dioxide, calcium carbonate, zinc oxide, aluminum oxide, cerium carbonate, cerium oxide, cerium fluoride, copper oxide, and cuprous oxide.

8. The vapor chamber according to claim 1, wherein the capillary grooves are disposed side by side; the groove wall of each of the capillary grooves defines communicating openings; the communicating openings on the groove wall of each of the capillary grooves are staggered with the communicating openings on the groove wall of an adjacent capillary groove.

9. The vapor chamber according to claim 1, wherein a depth of each of the capillary grooves in a direction perpendicular to the second cover plate is not less than a width of each of the capillary grooves in a direction parallel to the second cover plate.

10. The vapor chamber according to claim 9, wherein a width of each of the capillary grooves is in a range of 20-150 μm; the depth of each of the capillary grooves is in a range of 20-200 μm.

11. A heat dissipating device, comprising the vapor chamber according to claim 1.

* * * * *